United States Patent
Kikuchi (10) Patent No.: US 7,020,348 B2
(45) Date of Patent: Mar. 28, 2006

(54) DEVICE FOR EXPOSURE OF A STRIP-SHAPED WORKPIECE WITH A MEANDER CORRECTION DEVICE

(75) Inventor: Teruo Kikuchi, Yokohama (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 723 days.

(21) Appl. No.: 10/243,710

(22) Filed: Sep. 16, 2002

(65) Prior Publication Data

US 2003/0053678 A1    Mar. 20, 2003

(30) Foreign Application Priority Data

Sep. 17, 2001    (JP)    ............... 2001-281286

(51) Int. Cl.
*G06K 9/00*    (2006.01)
(52) U.S. Cl. .............. 382/289; 382/141; 382/151; 382/199
(58) Field of Classification Search ................ 382/141, 382/151, 199, 209, 289; 356/399, 400, 401; 355/41
See application file for complete search history.

(56) References Cited

U.S. PATENT DOCUMENTS 4,975,716 A * 12/1990 Hara et al. ................. 346/25
5,557,690 A * 9/1996 O'Gorman et al. ......... 382/151
6,064,778 A * 5/2000 Pasco et al. ................ 382/289
6,888,650 B1* 5/2005 Mizubata et al. ........... 358/488

FOREIGN PATENT DOCUMENTS

| JP | 09-070731 | 3/1997 |
|---|---|---|
| JP | 11-102077 | 4/1999 |
| JP | 11-334953 | 12/1999 |

* cited by examiner

*Primary Examiner*—Bhavesh M. Mehta
*Assistant Examiner*—John B. Strege
(74) *Attorney, Agent, or Firm*—David S. Safran (57) ABSTRACT

A device for exposure of a strip-shaped workpiece with a meander correction device which is capable of carrying out meander correction with high precision even in the case of a thin workpiece or the formation of static electricity. The device includes two means for edge determination which are located at two locations in the transport direction of the strip-shaped workpiece and which photographs the edge of the strip-shaped workpiece, a pattern formed by the intersection of a linear part of a mask and the workpiece edge, a CCD camera for capturing the pattern formed, an image processing part for recording the pattern and searching for matching preset patterns, and a controller for computing the amount of meander of the strip-shaped workpiece, outputting a control signal if the amount of meander is outside of a preset range, and correcting the meander by rotating the workpiece and/or moving the workpiece in the transverse direction.

6 Claims, 5 Drawing Sheets

Fig.9(a) Image of mask within field of CCD camera

Fig.9(b) stored pattern

DEVICE FOR EXPOSURE OF A STRIP-SHAPED WORKPIECE WITH A MEANDER CORRECTION DEVICE

BACKGROUND OF THE INVENTION

1. Field of the Invention

The invention relates to a device for exposure of a strip-shaped workpiece with a meander correction device, in which image processing determines the edge length information of the strip-shaped workpiece in the transverse direction and based on the obtained position information, the meander of the strip-shaped workpiece which occurs during transport is corrected.

2. Description of the Related Art

It is known that in a device for exposure of a strip-shaped workpiece (hereinafter also called a "workpiece"), a mask and the workpiece are aligned with one before exposure using alignment marks. These marks can be formed in the workpiece when a pattern which has been formed in the mask, such as a circuit or the like, is exposed onto the workpiece.

However, if a first exposure is carried out on the workpiece and neither the pattern, such as a circuit or the like, nor workpiece marks are formed, the above described positioning cannot be performed.

In the first exposure, the accuracy of the distance between the patterns to be exposed is determined by the positioning accuracy in the transport direction and depends on the transport accuracy with which the device transports the workpiece.

Furthermore, the distance in the transverse direction between the pattern and the workpiece edge is fixed. But if a meander forms during the transport of the workpiece, the position of the pattern to be formed deviates in the transverse direction or becomes slanted. Therefore, the meander of the workpiece must be corrected.

One technique which relates to meander correction of a strip-shaped workpiece is described in Japanese patent JP 9070731.

In the first embodiment in the aforementioned Japanese patent, two optical sensors formed of a light receiving component with a relatively large light receiving surface and an emission element are located upstream and downstream of a strip-shaped workpiece. This arrangement allows for a determination of a meander of the strip-shaped workpiece. Correction of the meander is done by holding the edge area of the strip-shaped workpiece with two clamps and stretching or pressing the workpiece in the transverse direction.

If the amount of light received by the light receiving component of the two optical sensors is within a predetermined meander tolerance range, it is assessed that there is no meander. When the amount of light received by the light receiving component of the two optical sensors is outside the predetermined meander tolerance range, the above described holding parts are moved by a distance which corresponds to the difference of the amount of light received, and thus the meander is corrected.

In a second embodiment of the aforementioned Japanese patent, there are two optical sensors upstream and two optical sensors downstream of the strip-shaped workpiece. Each optical sensor consists of a light receiving component with a relatively small light receiving surface and an emission element. The state in which the two light receiving components located on the inside are shielded and the two light receiving components located on the outside receive the light from the emission components is assessed as "meander not present". All other cases are assessed as "meander present". In cases of "meander present", the holding parts are moved and the meander is corrected in the above described manner.

In the first embodiment in the aforementioned Japanese patent, optical sensors with a relatively large light receiving surface are used. These optical sensors can be large and costly.

In the second embodiment in the aforementioned Japanese patent, the allowable meander area is fixed by the amount of light of the optical sensors or by the positions of the optical sensors, which are each located in two pieces. Fixing the tolerance of the meander of the workpiece is however difficult. This is especially true in the case of fixing the tolerance of the meander by the change in the amount of light of the optical sensors as disclosed in the first embodiment of the aforementioned Japanese patent. With respect to the adjusted threshold value of the amount of light in the first embodiment, sensors are needed which output signals with high precision and good reproducibility. There are many cases in which these sensors require a light source from which parallel laser light emerges, and are therefore very costly and large.

Furthermore, in the second embodiment of the aforementioned Japanese patent in which the allowable meander area is fixed by the positions of the optical sensors which are each located in two pieces, the sensor number is large, resulting in relatively high costs. Furthermore, it is difficult to install the sensors exactly at the fixed locations. They are installed mechanically, resulting in major errors as well.

In the above described Japanese patent, the strip-shaped workpiece is held by the clamps and thus meander correction is done. If the strip-shaped workpiece is relatively thin, the meander correction may fail because the clamps may be unable to hold the workpiece. Furthermore, depending on the types of workpieces, there are cases in which static electricity causes the workpiece carrier and the strip-shaped workpiece to stick to one another and therefore prevents movement of the workpiece. If the workpiece is relatively thin and soft, there are cases in which the clamps deform the workpiece, thereby preventing meander correction.

SUMMARY OF THE INVENTION

The object of the present invention is to eliminate the disadvantages found in the prior art by providing a device for exposing a strip-shaped workpiece, in which an image processing device determines the position of the workpiece edge and corrects any meander based on the received position information of the edge. In this way, meander correction is completed with high accuracy, and in the case of a thin workpiece or formation of static electricity, meander correction can also be done with certainty.

Instead of the optical sensors disclosed in the aforementioned Japanese patent, a determination of the position of the edge of the strip-shaped workpiece and correction of the meander is completed as described below by using a microscope which has a relatively small CCD camera, which determines the alignment marks with high precision, and an image processing part.

There is a first means for edge determination and a second means for edge determination at two locations in the transport direction of the strip-shaped workpiece. Each means has a CCD camera which photographs the edge of the strip-shaped workpiece. Furthermore, within the visual field of the CCD camera of each means, there is a mask which has a linear part which intersects the workpiece edge.

In the image processing part, a pattern is recorded which is formed by a combination of the lines which form from the intersection of the above described mask and the workpiece edge, and which for example has an L-shape or a concave shape.

The image processing part looks for the above described recorded pattern in the internal area of the visual field of the CCD camera of the means for edge determination and determines the position coordinates of the edge of the workpiece. Based on the position coordinates of the workpiece edge at two locations, a controller computes the amount of meander of the strip-shaped workpiece, outputs a control signal if the amount of meander is greater than a predetermined value, and moves the workpiece in the transverse direction and/or direction of rotation such that the amount of meander is corrected.

In the above described method, the strip-shaped workpiece is held by a workpiece carrier. The workpiece is moved and turned in the transverse direction by movement of the workpiece carrier which is driven by the output of the controller, thereby correcting the meander of the workpiece.

Therefore, the present invention allows for a means of edge determination by using two-dimensional CCD cameras, which record a pattern of lines formed by the intersection of a linear part of a mask and the workpiece edge. This pattern of lines is typically L-shaped or concave shaped. The inner area of the visual field of the CCD camera is searched by this recorded pattern and the edge position of the strip-shaped workpiece is determined by using the means for edge determination with the CCD cameras and the image processing part which was used for conventional alignment of the mask and the workpiece. Therefore, the amount of meander of the strip-shaped workpiece can be determined and this amount of meander corrected. Furthermore, the time for determining the amount of meander can be shortened even more compared to the conventional example, in which the strip-shaped workpiece moves in its transverse direction and based on the operating timing of the above described two optical sensors the meander of the strip-shaped workpiece is determined.

Since especially only the arrangement of the means for edge determination with the CCD camera in a conventional device can determine the edge of the strip-shaped workpiece and correct the amount of meander, the arrangement compared to the conventional case in which optical sensors are used can be simplified even more. Furthermore, using relatively cheap determination means, meander correction can be done with high precision.

Furthermore, the present invention prevents the holding clamps from failing during meander correction of the workpiece. Furthermore, meander correction can be easily done when static electricity causes the workpiece carrier and the strip-shaped workpiece to stick to one another. It therefore becomes possible to carry out meander correction even with a thin workpiece without deformation.

DETAILED DESCRIPTION OF THE INVENTION

The invention is described below using one embodiment of a projection exposure device in which a mask pattern is projection-exposed onto a strip-shaped workpiece W. The invention can be used not only for the projection exposure device shown in the embodiment described below, but also for a contact exposure device in which the mask and a workpiece are brought into contact with one another and exposure is done, and for a proximity exposure device in which a mask and a workpiece are brought close to one another and exposure is carried out.

Figure 1:
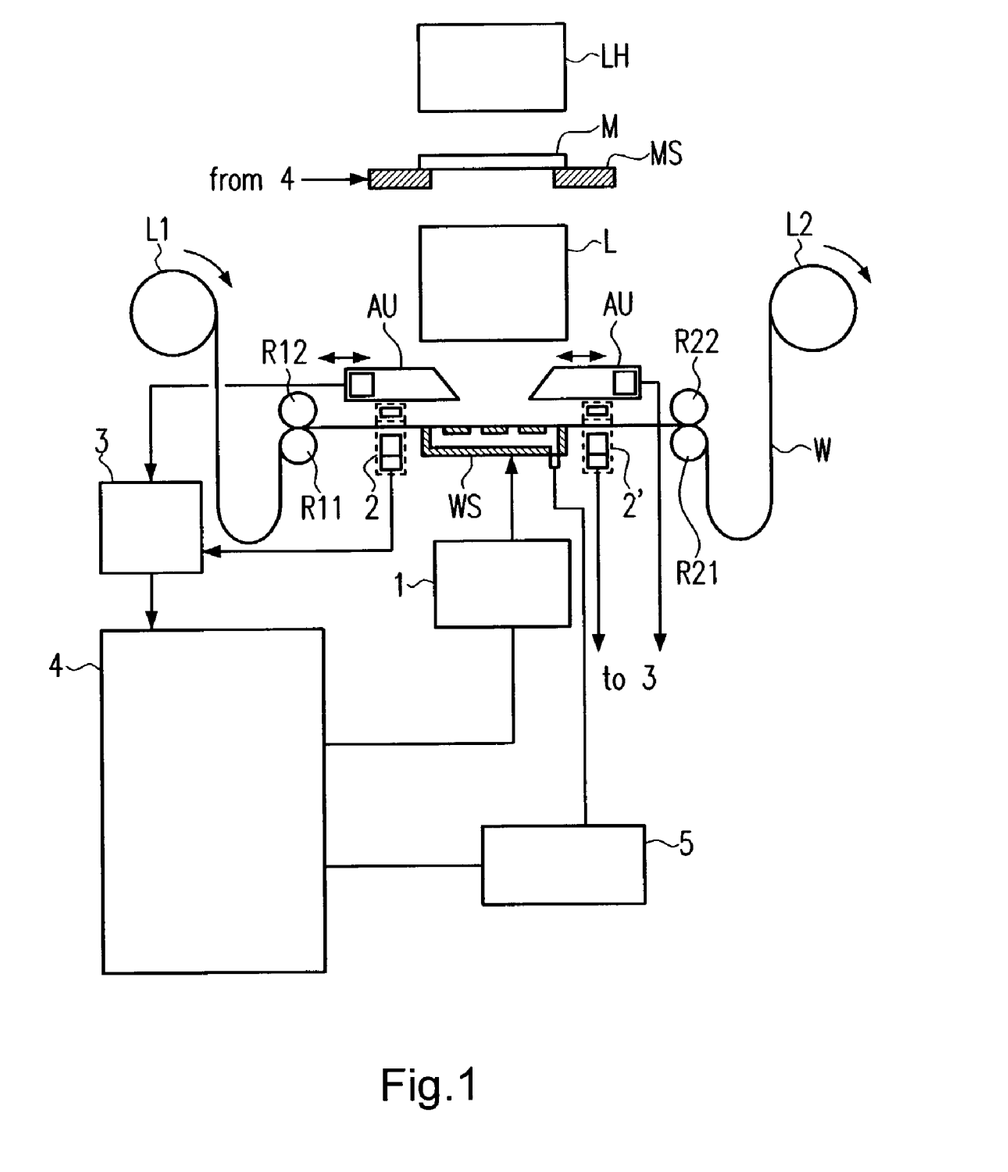
FIG. 1 shows a device for exposing a strip-shaped workpiece.
Figure 2:
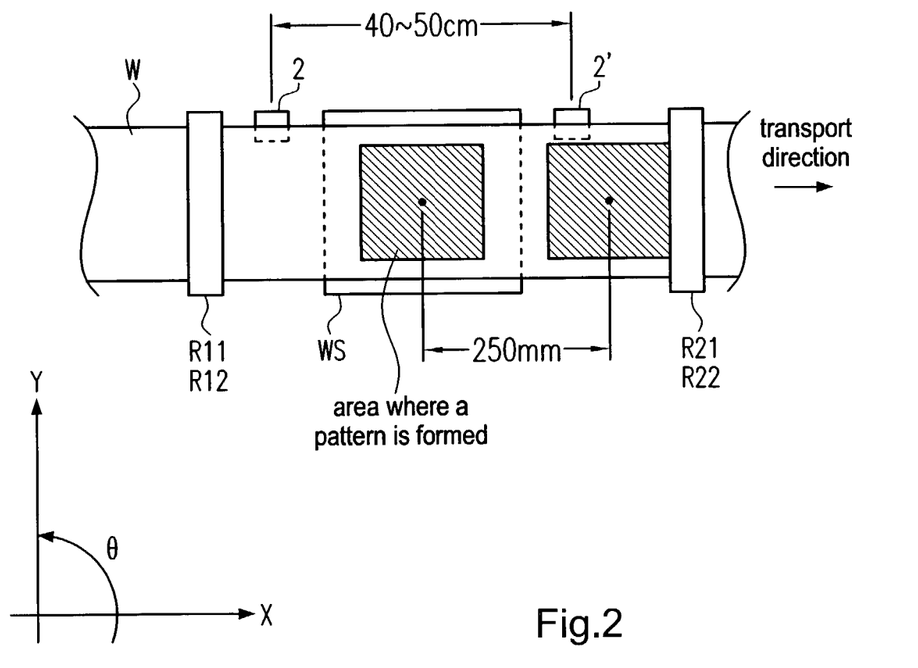
FIG. 2 shows a device for exposing a strip-shaped workpiece as shown in FIG. 1 was viewed from the top.

FIGS. 1 and 2 show a take-off roller L1 around which the not yet exposed strip-shaped workpiece WS is wound, a braking roller R11, pressure rollers R12 and R22, a drive roller R21, and a take-up roller L2 onto which an already exposed strip-shaped workpiece is wound.

Furthermore, FIG. 1 shows a light irradiation part LH which emits exposure light/nonexposure light, a mask M on which a mask pattern and mask alignment marks are recorded, a mask carrier MS on which the mask M is placed, and a projection lens L. The exposure light/nonexposure light emitted by the light irradiation part LH is emitted onto the mask M. The mask pattern recorded on the mask M and the alignment marks recorded on the mask M are projected via the projection lens L onto the strip-shaped workpiece W on a workpiece carrier WS.

The strip-shaped workpiece W is clamped by the drive roller R21 and the pressure roller R22. By turning the drive roller R21, the strip-shaped workpiece W is unwound from the take-off roller L1, transported to the exposure position of the workpiece carrier WS, positioned at a given position, and exposed. The previously exposed strip-shaped workpiece W is wound onto the take-up roller L2.

In the workpiece carrier WS, to hold the strip-shaped workpiece W there is a vacuum suction device 5. When the workpiece W is positioned at a given position, it is attached to the workpiece carrier by suction by the vacuum suction device 5.

As shown in FIGS. 1 and 2, a device 1 for moving the workpiece carrier moves the workpiece carrier WS on which the strip-shaped workpiece W is attached by suction, at least in the transverse direction of the strip-shaped workpiece (hereinafter this direction is called the "Y direction") and moreover rotates it along an axis perpendicular to the workpiece carrier surface acting as a shaft (hereinafter this rotation is called "movement in the θ direction"). Thus, meander correction of the strip-shaped workpiece W is carried out.

Afterwards the strip-shaped workpiece W is irradiated via the mask M with exposure light on the light irradiation part LH and the mask pattern is exposed.

Figure 3:
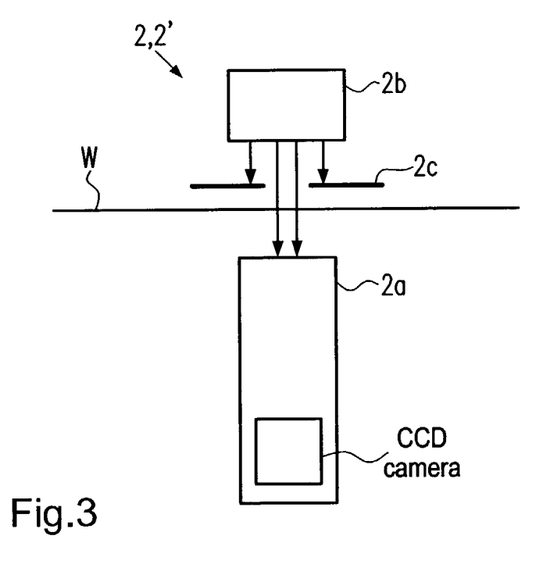
FIG. 3 shows a sample arrangement of an edge determination unit of the present invention.

As shown in FIG. 3, edge determination units 2 and 2' each consist of a microscope 2a which has a two-dimensional CCD camera, an emission part 2b of an LED-type or the like, and masks 2c for edge determination. The masks 2c are located in the workpiece transport direction (X direction) of the workpiece carrier at two locations, i.e. front and back. The installation state between the edge determination units 2 and 2' depends on the size of the workpiece carrier, but is roughly 40 cm to 50 cm.

The visual field of the above described CCD camera in this embodiment is approximately 10 mm×10 mm. In the transport of the strip-shaped workpiece W, the CCD camera is located at the position which the edge of the strip-shaped workpiece W reaches. The signals from the edge determination units 2, 2' are sent to an image processing part 3 and are then subjected to image processing, by which the position coordinates of the edge are determined. The position coordinates are then sent to the controller 4, as shown in FIG. 1.

The distance between the two edge determination units 2 and 2' is roughly 40 cm to 50 cm, as was described above. The amount of meander per transport of the strip-shaped workpiece (the amount of transport is roughly 250 mm) at this distance is usually at most 1 mm to 3 mm.

The amount of meander can be kept roughly at the above described amount by suitable control of the drive roller R21, the braking roller R11, and the like. This prevents the edge of the workpiece from extending beyond the visual field of 10 mm×10 mm of the CCD camera of the edge determination units 2, 2' during one-time transport.

When exposure is done a second time or more often, after the first exposure on the strip-shaped workpiece W has formed the mask pattern and alignment marks, using the alignment marks which were formed in the workpiece W and using the alignment marks which were formed in the mask, positioning of the mask M to the workpiece W is carried out.

Figure 4:
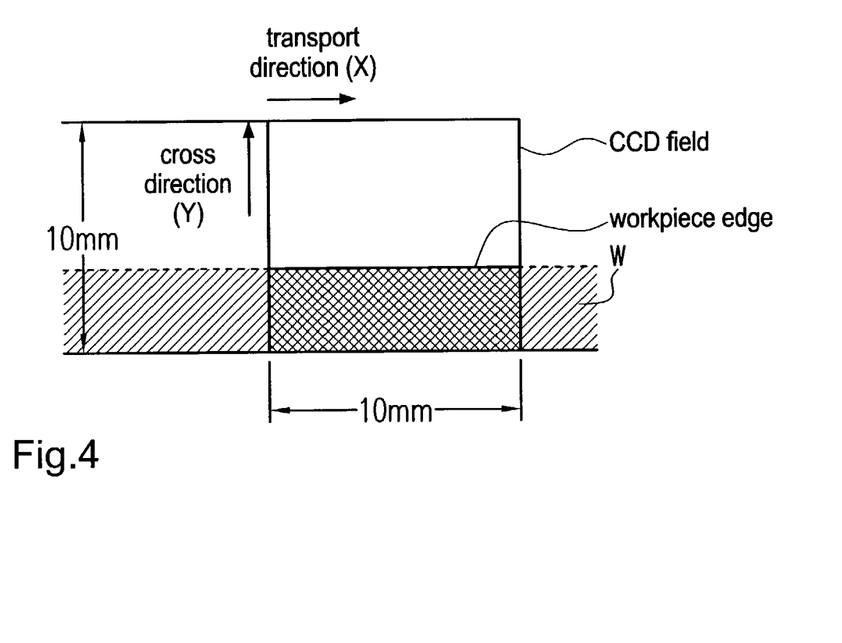
FIG. 4 shows an example of the image of the workpiece edge which is projected into the visual field of a CCD camera.

Therefore, as shown in FIG. 1, there are alignment units AU corresponding to the number of workpiece marks which have been recorded on the strip-shaped workpiece W and which are used for one-time positioning. The alignment units AU are arranged to be able to move in the arrow directions as shown in FIG. 4. They are moved during alignment such that the workpiece marks within the exposure area can be determined and with exposure of the strip-shaped workpiece W they are removed from the exposure area.

During alignment, the images of the alignment marks of the mask, which have been imaged on the strip-shaped workpiece W, and the workpiece alignment marks, which have been recorded on the strip-shaped workpiece W by the alignment units AU, are received and sent to the image processing part 3. In the image processing part 3, the images of the alignment marks of the mask M and of the workpiece W are subjected to image processing and the position coordinates of the alignment marks of the mask and of the workpiece are determined. The determined position coordinates of the alignment marks of the mask and of the workpiece are sent to the controller 4. The controller 4 drives the mask carrier MS and aligns the mask M and the strip-shaped workpiece W such that the alignment marks of the mask and the alignment marks of the workpiece achieve a preset positional relationship.

Furthermore, the controller 4 controls the drive roller R21 and the like, carries out positioning and the like of the strip-shaped workpiece W, and, based on the edge position of the strip-shaped workpiece W sent by the image processing part 3, drives the device 1 for moving the workpiece carrier and carries out meander correction of the strip-shaped workpiece. Afterwards, the mask pattern is exposed onto the workpiece.

Operation of the meander correction of the strip-shaped workpiece in the device in this embodiment is described below.

As was described above, the strip-shaped workpiece W is clamped by the drive roller R21 and the pressure roller R22. By turning the drive roller R21, the strip-shaped workpiece W is transported to the exposure position of the workpiece carrier. During transport, the strip-shaped workpiece W is clamped by the braking roller R11 and the pressure roller R12. This prevents the strip-shaped workpiece W from folding during transport.

Furthermore, to prevent the surface of the workpiece carrier WS and the back of the workpiece W from coming into contact with one another, during transport of the strip-shaped workpiece W, the workpiece carrier WS is moved slightly down, or air is blown from the surface of the workpiece carrier WS in the direction to the workpiece W. The distance of one-time transport depends on the size of the pattern formed in the workpiece and on the distance between the set patterns, but in this embodiment is roughly 250 mm.

When the strip-shaped workpiece W is advanced by the set transport distance, rotation of the drive roller R21 is stopped and thus transport of the workpiece W is stopped. The vacuum suction device of the workpiece carrier WS is operated and the workpiece W is held on the workpiece carrier WS.

The two pressure rollers R22 and R12 which correspond to the drive roller R21 and the braking roller R11 move up, by which the clamping of the strip-shaped workpiece W is released. The CCD cameras of the two edge determination units 2, 2' take the picture of the edge of the strip-shaped workpiece W.

The edge picture which has been taken by the CCD camera of the edge determination units 2, 2' is sent to the image processing part 3 and subjected to image processing. In the image processing part 3, the position coordinates of the edge are determined at two locations. The position coordinates of the edge at the two locations are sent to the controller 4 which computes the amount of meander of the strip-shaped workpiece W.

If the computed amount of meander is within a preset tolerance range of the amount of meander, exposure is carried out without changing this state.

If the amount of meander is greater than the preset tolerance range of the amount of meander, the controller 4 computes the direction of motion and the distance moved by the workpiece carrier WS, with which the amount of meander falls within an allowable range.

Based on the above described computation result, the controller 4 outputs a command to move the workpiece carrier WS of the device 1 for moving the workpiece carrier.

The device 1 for moving the workpiece carrier moves the workpiece carrier WS in the state in which the strip-shaped workpiece W is held by vacuum suction. Thus the meander is corrected. To confirm whether the correction of the meander has been properly carried out, the computed amount of meander is once again compared to the preset tolerance range of the amount of meander.

Exposure light is then emitted from the light irradiation part LH. The mask pattern formed on the mask M is imaged onto the strip-shaped workpiece W on the workpiece carrier WS via the projection lens L. In this way exposure is carried out.

When exposure is ended, the pressure rollers R12 and R22 move down and clamp the strip-shaped workpiece W. The vacuum suction of the workpiece carrier WS is released and the drive roller R21 turns. The workpiece W is thus transported to the next exposure position. The workpiece carrier WS returns to the zero position when movement in the Y-θ direction for meander correction has taken place.

The process for determining the edge of the strip-shaped workpiece W by the edge determination units 2, 2' and the image processing part 3 are described below.

In the case of determining the alignment marks by image processing for positioning of a mask to a workpiece, normally the forms of the alignment marks pattern to be determined are recorded in the image processing part.

The alignment mark images of the mask M and the workpiece W which were taken by the above described alignment units AU are sent to the image processing part 3. With the image processing part 3, the internal area of the visual field of the CCD camera of the alignment units AU is searched. When the video information delivered to the cameras agrees with the recorded patterns of the mask, it is assessed that the alignment marks have been determined and their position coordinates are determined.

The edge position of the strip-shaped workpiece is determined using the image processing part 3 by the same algorithm as in the determination of the alignment marks.

What the edge determination units 2, 2' determine for meander correction is not the alignment marks, but the edge of the strip-shaped workpiece W. The edge of the strip-shaped workpiece W is line-shaped. The image of the workpiece edge which is projected by the CDD cameras in their visual field, as shown in FIG. 4, is a straight shadow which extends essentially in the entire visual field in the workpiece transport direction.

Figures 5, 6:
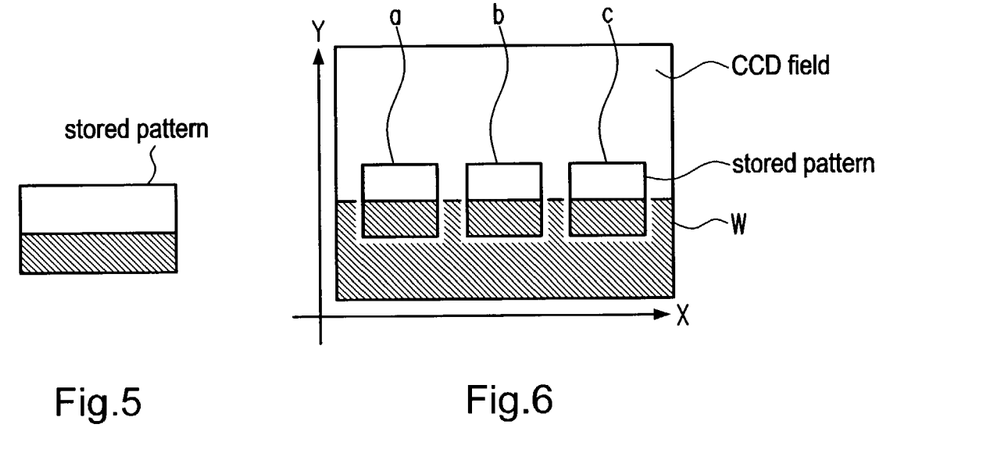
FIG. 5 shows an example of a recorded pattern for edge determination.
FIG. 6 shows a case in which a pattern search is carried out on the image as shown in FIG. 4 by the recorded pattern as shown in FIG. 5.

In this case, the line-shape which is recorded for determining the edge becomes the patten which has been formed by removing part of the edge and which consists of a single line, as is shown in FIG. 5.

If the recorded pattern has the shape of only a single line, the images which are recorded by the CCD cameras of the edge determination units 2, 2' are straight in the entire visual field, as is shown in FIG. 6. The recorded patterns therefore for example agree with one another at all locations a, b, and c. Besides locations a, b, and c, there are innumerable locations at which they agree with one another.

With respect to the property of the image processing device, it is difficult to record an image pattern which extends in the entire visual field of the CD camera. Therefore a state as shown in FIG. 6 arises.

In this state, the position of the edge of the workpiece in the transverse direction (Y direction) is fixed. However, the position of the edge of the workpiece in the transport direction (X direction) is not fixed in this state.

Figure 7:
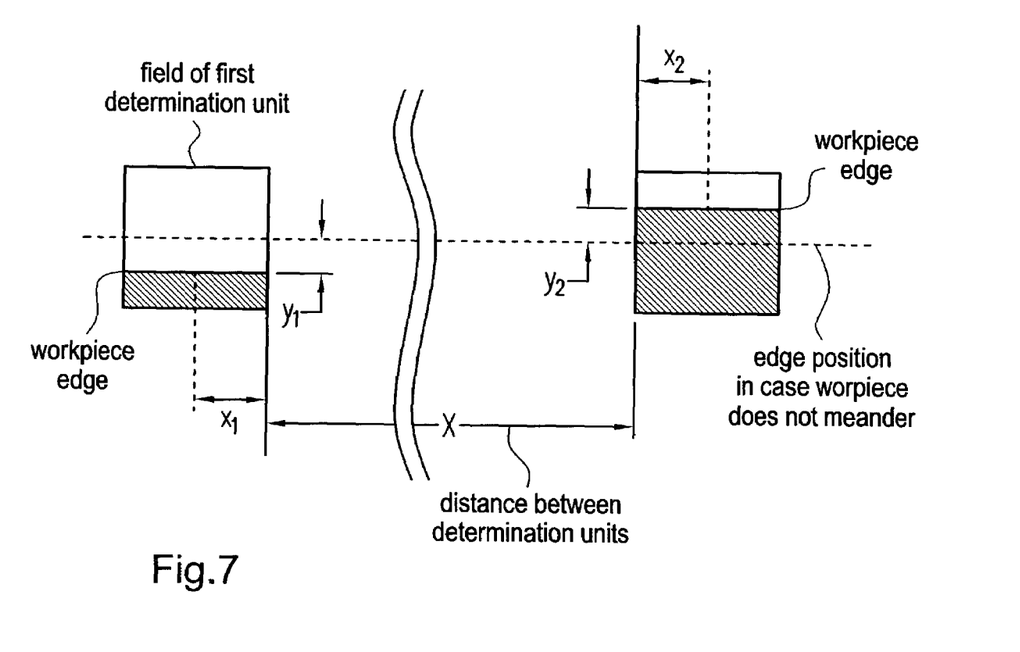
FIG. 7 shows the correction of the amount of meander.

If meander correction of the strip-shaped workpiece is carried out, based on the first edge position coordinates (x1, y1) which are determined by the first edge determination unit 2, based on the second edge position coordinates (x2, y2) which are determined by the second edge determination unit 2', and based on the distance between the two edge determination units 2, 2' the amount of meander is computed, and the direction of motion and the amount of motion of the strip-shaped workpiece W for correction of the meander are determined, as is shown in FIG. 7.

Figure 8:
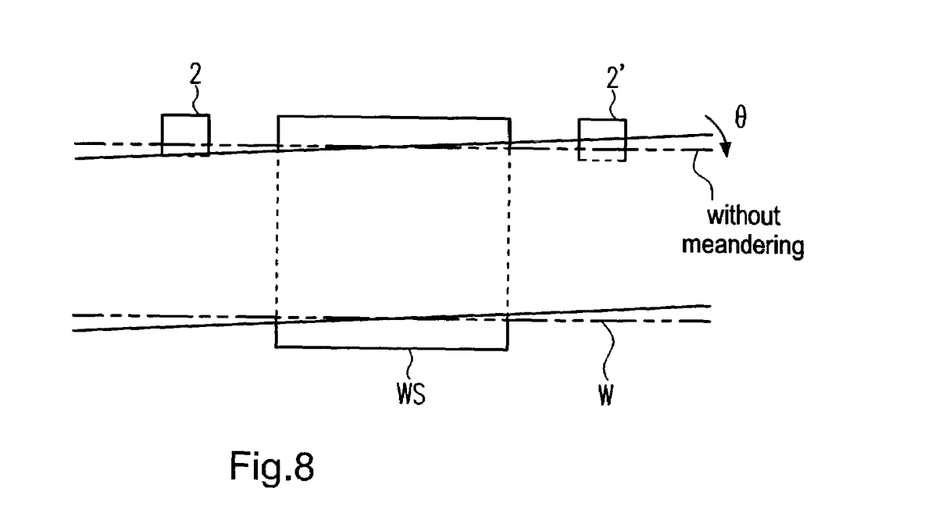
FIG. 8 shows a schematic of the state of the strip-shaped workpiece in FIG. 7.

For example, in the case shown in FIG. 7, the strip-shaped workpiece has the meander shown in FIG. 8. In this case, it is necessary to turn the strip-shaped workpiece in the θ direction to correct the meander. But if the above described X coordinate is not fixed, it cannot be computed, around which position of the workpiece rotation should take place. Therefore meander correction cannot take place.

Figure 9A:
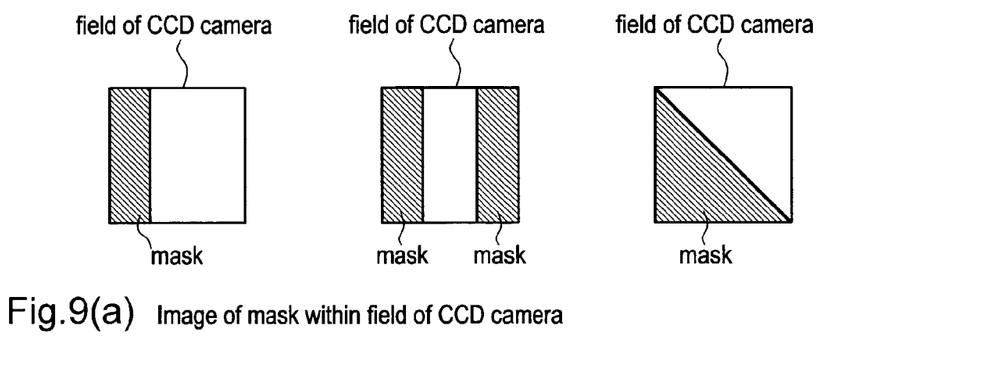
FIG. 9 shows possible images of a mask in the visual field of a CCD camera and possible recorded patterns.
Figure 9B:
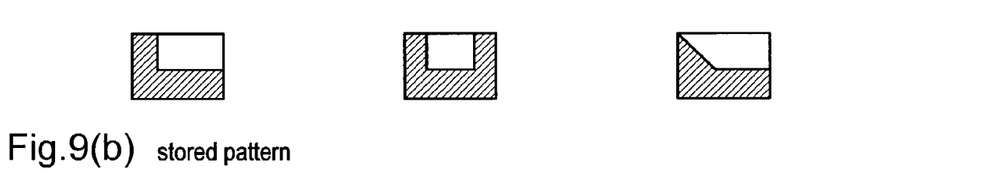

Therefore, as shown in FIG. 3, the edge determination units 2, 2' are each formed from one microscope 2a each which has a two-dimensional CCD camera, from an emission part 2b which consists of a LED or the like, and from a mask 2c for edge determination. The pattern of the mask 2c is formed in a shape as shown in FIG. 9(a) such that when the workpiece edge is determined in the visual field of the CCD camera a linear pattern appears which intersects this workpiece edge. Furthermore, one pattern at a time according to FIG. 9(b) is recorded as the pattern which is recorded for determining the edge.

Figure 10A:
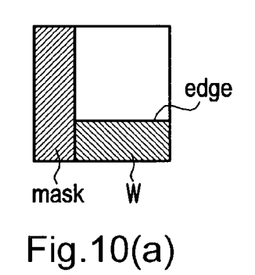
FIG. 10 shows possible images of a CCD camera of a mask and the corresponding stored patterns for which a pattern search of the recorded pattern and the image of the CCD camera agree with one another.
Figure 10B:
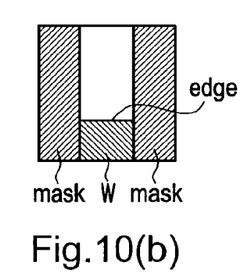
Figure 10C:
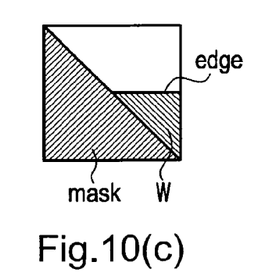
Figure 10D:
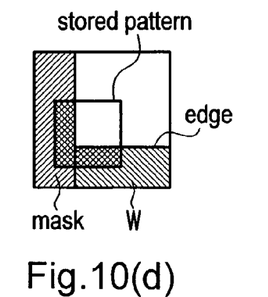
Figure 10E:
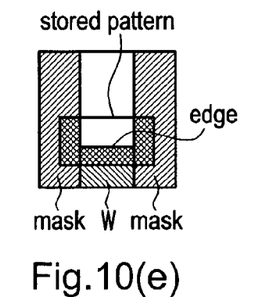
Figure 10F:
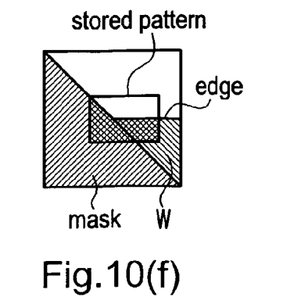

As shown in FIG. 10(a), (b), and (c), in the determination of the edge of the strip-shaped workpiece W, the CCD cameras of the edge determination units 2, 2' take a picture which is formed by the mask 2c and the edge of the strip-shaped workpiece W and which has an L-shape, a concave shape or a shape which is formed by a combination of a sloped line with a straight line. Therefore, in the image processing part 3, the internal area of the CCD camera is searched with the recorded pattern using the algorithm which was used in the above described alignment, as shown in FIG. 9(b). When the video information recorded by the CCD cameras agrees with the recorded pattern, as is shown in FIG. 10(d), 10(e) and 10(f), it is assessed that the edge position has been determined and its position coordinates (X-Y coordinates) are determined.

The shape of the recorded pattern can be formed by two straight lines as described above such that in the visual field of the CCD cameras of the edge determination units 2, 2', there is a mask on the straight line which intersects the workpiece edge. Therefore the position of the workpiece edge can be determined not only in the Y direction, but also in the X direction.

If the position coordinates (X-Y coordinates) of the edge position are determined at two locations in the above described manner in the image processing part 3, the controller 4, based on the position coordinates at the above described two locations, computes the amount of meander of the strip-shaped workpiece W. If the amount of meander exceeds the preset "tolerance of the meander", the workpiece carrier, in the state in which the strip-shaped workpiece is held by the device 1 for moving the workpiece carrier in the workpiece carrier by vacuum suction, is moved in the Y direction and θ direction so that the amount of meander falls into the allowable range.

Strictly speaking, there are also cases in which the workpiece edge is oblique in the visual field of the CCD camera of the edge determination units 2, 2'. But since the amount of meander with respect to the distance between the edge determination units 2 and 2' is small, there is no case in which the workpiece edge is so oblique that it no longer agrees with the recorded pattern.

By the measure that means for edge determination are used which each have a two-dimensional CCD camera which determines the workpiece edge, that within the visual field of the CCD camera there is a mask with a linear part which intersects the workpiece edge to be determined, that the L-shape or concave shape formed by this mask and the workpiece edge is recorded as the pattern for edge position determination, that the inner area of the visual field of the CCD camera is searched with this recorded pattern and that the edge position of the strip-shaped workpiece is determined, not only the workpiece transverse direction (Y direction) of the workpiece edge position, but also the transport direction (X direction) thereof can be determined. Therefore, using the means for edge determination which each have a CCD camera and using the image processing part which is used for conventional alignment of the mask and the workpiece, the amount of meander of the strip-shaped workpiece can be determined and this amount of meander can be corrected with high precision.

Since solely by the arrangement of the means for edge determination which each have a CCD camera in a conventional device can the edge of the strip-shaped workpiece be determined and the amount of meander corrected, the arrangement compared to the conventional arrangement in which optical sensors are used can be simplified. Furthermore, using relatively inexpensive means of determination, meander correction can be carried out with high precision. In addition, the time for determining the amount of meander compared to the conventional case can be shortened.

Correction of the meander in the state in which the workpiece is sucked on the workpiece carrier meander prevents failure in holding. Furthermore, meander correction can be easily done even when static electricity causes the workpiece carrier and the strip-shaped workpiece to stick to one another. It therefore becomes possible to carry out meander correction even with a thin workpiece without deformation.

I claim:

1. A device for exposing a mask pattern onto a workpiece, comprising:

a first and second means for edge determination which are located at two locations in a transport direction of the strip-shaped workpiece and which produce signals indicative of transverse positioning of an edge of a strip-shaped workpiece, and which each have an image collection means for photographing the edge of the strip-shaped workpiece;

a first mask which is located in a visual field of the image collection means of the first means for edge determination and which has a linear part which, in use, intersects the edge of said workpiece;

a second mask which is located in the visual field of the image collection means of the second means for edge determination and which has a linear part which, in use, intersects the edge of said workpiece;

an image processing part for processing the signals from the first means for edge determination and the second means for edge determination, comparing photographed images from the image collection means to a pre-recorded registration pattern and determining position coordinates of the edge of the workpiece;

a controller for computing an amount of meander of the strip-shaped workpiece based on the position coordinates of the edge of the workpiece at two locations which have been determined based on the images of the edge which have been photographed by the first means for edge determination and the second means for edge determination, and for outputting a control signal when the computed amount of meander is greater than a preset amount of meander; and a means for correcting the meander of the strip-shaped workpiece according to the above described control signal.

2. The device for exposing a strip-shaped workpiece of claim 1, wherein the meander correction means of the strip-shaped workpiece comprises:

a workpiece carrier for correcting the position of the workpiece, and a means for moving the workpiece carrier in the transverse direction of the strip-shaped workpiece and rotating the strip-shaped workpiece.

3. The device for exposing a strip-shaped workpiece of claim 2, wherein the meander correction means, according to the output of the controller, moves the workpiece carrier and thereby moves and rotates the strip-shaped workpiece, thereby correcting the meander of the workpiece.

4. The device for exposing a strip-shaped workpiece of claim 1, wherein the masks have linear part configured and arranged to form, in use, an L-shaped or concave-shaped pattern relative to the workpiece.

5. The device for exposing a strip-shaped workpiece of claim 1, wherein the image collection means is a CCD camera.

6. The device for exposing a strip-shaped workpiece of claim 1, wherein the image processing part is a video processor.

* * * * *